Dec. 12, 1967 R. M. SCARLETT 3,358,197

SEMICONDUCTOR DEVICE

Filed May 22, 1963

3 Sheets-Sheet 1

INVENTOR.
ROBERT M. SCARLETT

BY

Flehr and Swain
ATTORNEYS

Dec. 12, 1967 R. M. SCARLETT 3,358,197

SEMICONDUCTOR DEVICE

Filed May 22, 1963

3 Sheets-Sheet 2

INVENTOR.
ROBERT M. SCARLETT

BY

Flehr and Swain
ATTORNEYS

INVENTOR.
ROBERT M. SCARLETT
BY Arthur L. Lessler
ATTORNEY 3,358,197
SEMICONDUCTOR DEVICE
Robert M. Scarlett, Palo Alto, Calif., assignor, by mesne assignments, to International Telephone and Telegraph Corporation, New York, N.Y., a corporation of Maryland
Filed May 22, 1963, Ser. No. 282,398
17 Claims. (Cl. 317—235)

This invention relates generally to a semiconductor device and more particularly to a semiconductor device capable of handling relatively high power.

High power semiconductor devices generally include operating regions having a relatively large extent or area so that the power is distributed over the device to keep the power per unit area within safe limits. However, a serious limitation exists in the power handling capacity of many semiconductor devices, for example, power transistors, due to a form of thermal instability which causes current concentrations to develop in the large area structures. This type of thermal instability is one in which the current density and temperature tend to build up in a confined area of the device at the expense of the remaining active device area while the total external current remains substantially constant. The instability arises from a large positive temperature coefficient of current flow in the device. Because of the large positive temperature coefficient of current flow, any random fluctuations in current flow or imperfections in the device itself may produce an increase in current in one part of the structure with respect to another. This increase in current, in turn, produces additional heating and further increases in current in this portion of the device. In essence then, positive feedback occurs with the resultant build-up of current in one portion of the device. The current may build up to such an extent as to cause non-linear effects and even burn-out of the device.

It is a general object of the present invention to provide a large area semiconductor device capable of handling relatively large power.

It is another object of the present invention to provide a semiconductor device in which the current temperature instability referred to above is minimized.

It is a further object of the present invention to minimize the instability in high power devices by introducing in series with the active portion of the emitter base junction the resistance of a portion of the emitter region itself.

It is a further object of the present invention to provide a semiconductor device including a large area emitter having a common portion with a plurality of outward extensions having portions which form a relatively active emitter base junction and other portions which form a relatively inactive emitter base junction with the latter providing in series with each of the active areas a series resistance which produces a voltage drop dependent on the current to give rise to a negative feedback effect to counteract increases in current in unstable active portions.

These and other objects of the invention will become more clearly apparent from the following description when taken in conjunction with the accompanying drawing.

Referring to the drawing.

Figure 1:
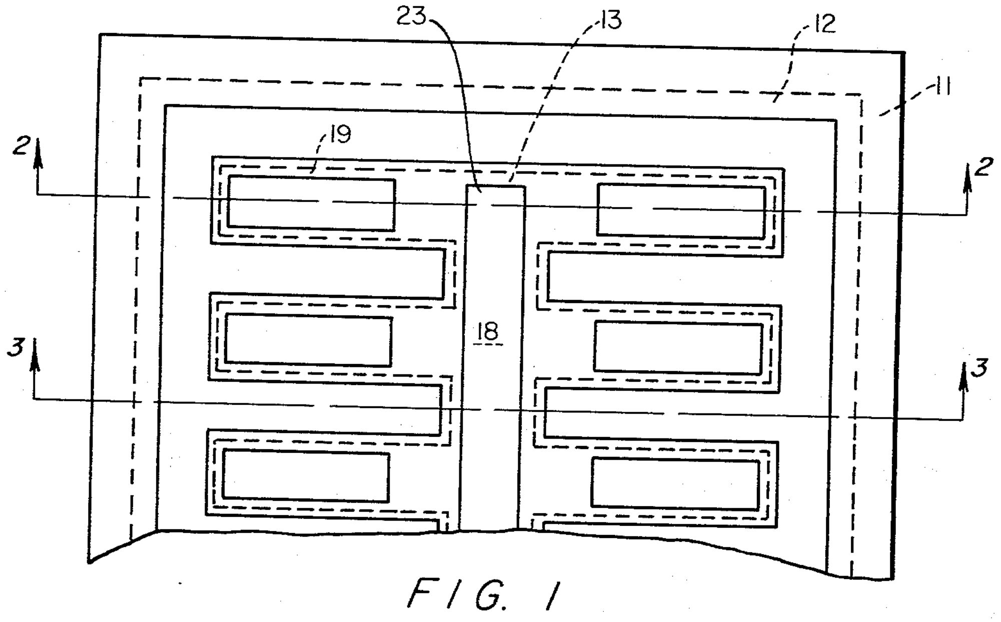
FIGURE 1 is a plan view of a portion of a planar power transistor.
Figure 2:
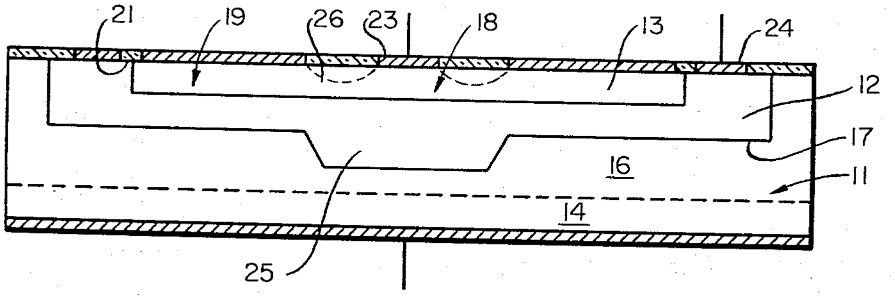
FIGURE 2 is a sectional view taken along the line 2—2 of FIGURE 1.
Figure 3:
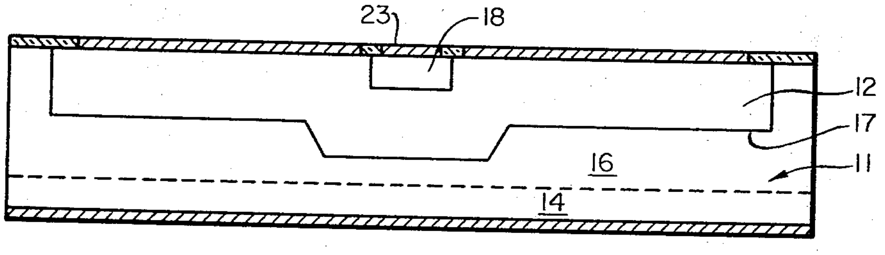
FIGURE 3 is a sectional view taken along the line 3—3 of FIGURE 1.

Referring specifically to FIGURES 1, 2 and 3, there is shown a power transistor which includes a body of semiconductive material having a collector region 11 of one conductivity type, for example, n-type; a base region 12 of opposite conductivity type, for example, p-type; and an emitter region 13 of said one conductivity type, for example, n-type. The collector region illustrated includes a first portion 14 which has a relatively high concentration of impurities to provide a relatively high conductivity of carriers and a contiguous region 16 which has a lower concentration of impurities and provides a relatively high reverse breakdown voltage base-collector junction 17.

The collector-base junction and body may be formed by epitaxially growing the high impurity collector portion 14 onto a substrate having a lower concentration of impurities and subsequently diffusing the p-type region into the original substrate to form the junction 17.

Figure 7:
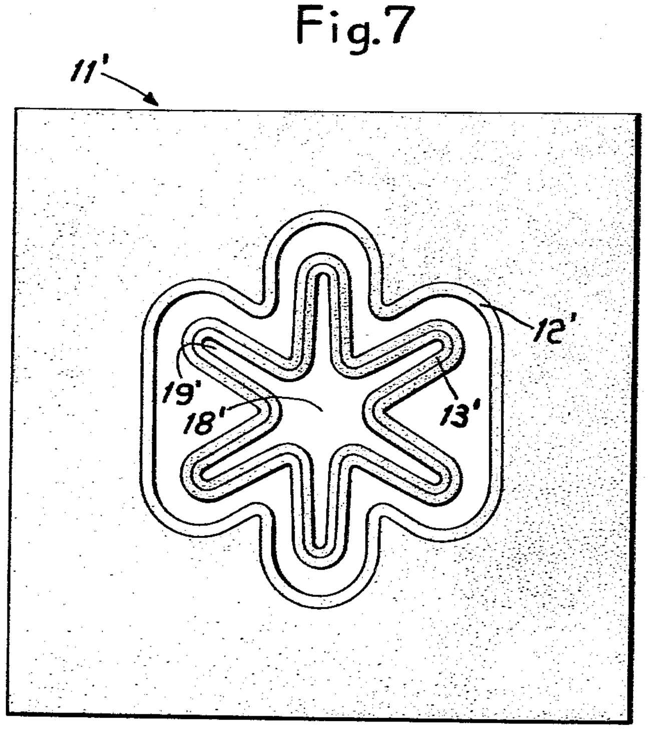
FIG. 7 shows a transistor having a star-shaped emitter structure to which the present invention is applicable.
Figure 8:
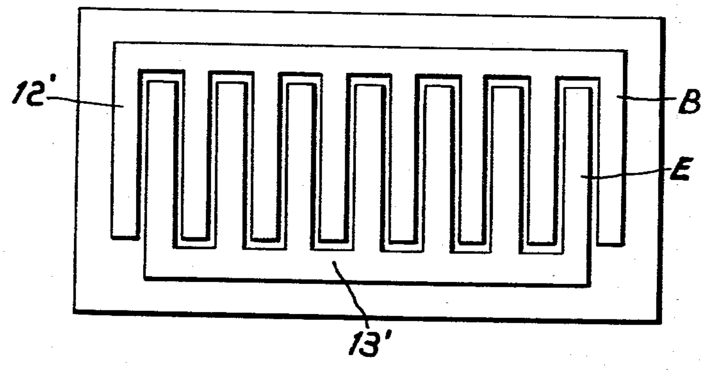
FIG. 8 shows a transistor having a comb structure to which the present invention is applicable.

The emitter region includes a common portion 18 with outward extensions 19 providing an emitter-base junction having a relatively long periphery. It will be apparent that although a backbone and rib structure is shown, the present invention is applicable to other structures such as the star-shaped structure shown in FIG. 7 and the comb structure shown in FIG. 8, and the like. The base region is relatively thick opposite the backbone or common portion of the emitter to reduce injection whereby this portion of the device is relatively inactive.

The base region may be formed by diffusing a first region, corresponding to the thicker portion of the base, through a window formed in a suitable mask, such as an oxide mask. During diffusion, a new oxide coating will be formed on the window portion and the remaining oxide layer will become slightly thicker. A new window is thus formed on the oxide surface layer. This window will be of the size and configuration desired for the base region. A subsequent diffusion will form a base layer of the desired thickness at the active portions of the device and a relatively thick base 25 opposite the backbone or common portion of the emitter.

During the diffusion, a new oxide layer will be formed over the entire surface of the device. Subsequently, a window having the desired emitter configuration may be opened in the oxide layer as, for example, by masking and etching to expose the underlying region of the base. A subsequent diffusion in the presence of donor impurities will form by diffusion the inset emitter region having the desired configuration, i.e., common portion with outward extensions. The emitter-base junction will extend upwardly and terminate at the common surface 21 of the base region and emitter region. As is well known, the thermally grown oxide layer serves to protect the ends of the junction.

Ohmic contacts 23 and 24 may be made with the base region and the common portion 18 of the emitter region by masking and etching windows in the oxide coating to expose predetermined portions of the underlying base and emitter regions. Subsequently, aluminum contacts are evaporated onto the base region and emitter region to provide the ohmic connections 23 and 24 described above with the emitter and base regions, respectively.

The ohmic connection with the base comprises a plurality of fingers which are interdigitated or interleaved with the emitter extensions to provide ohmic connection at substantially all portions of the base region adjacent the emitter-base junction.

The relatively thick base region adjacent the ohmic contact to the common portion of the emitter provides a relatively low alpha whereby this portion of the emitter-base junction is relatively inactive while the ends of the emitter extensions have a relatively active junction area.

Thus, there is provided in series between the contact 23 and the active portions of the emitter region the resistance of the emitter region itself. If it is desired to maintain each segment of the operating portion of the emitter-base junction at substantially equal potential during operation, a low resistance surface layer may be formed opposite each segment of the operating portion of the emitter-base junction. This surface layer is separated from the common emitter contact whereby the portion 26 of the emitter is in series with the current path to each segment.

The thickness of this portion of the emitter region and its impurity concentration is selected so that is resistance is such as to give a voltage drop between the common contact and operating area of several times the thermal voltage under operating conditions. If the resistance is too low, the emitter region may be notched as shown by the curved dash lines in FIG. 2 to remove material from the high impurity concentration upper surface region which has the highest conductivity. This will increase the series resistance introduced between the common contact and the operating regions.

Operation of the device to minimize thermal "hot spots" can be readily appreciated by considering the current flow. If the current increases in any emitter segment, the current through the series resistance offered by the emitter region will increase, thereby increasing the voltage drop. The emitter-base voltage is lowered to lower the injection. This lowers the total current flowing through the device and consequently reduces heating. In essence then, this is a form of negative feedback.

The device shown in FIGURES 1, 2 and 3 is a planar transistor in which the base, emitter and collector have portions which extend to a common surface with each of the junctions extending to said common surface and protected by an oxide layer.

Figure 4:
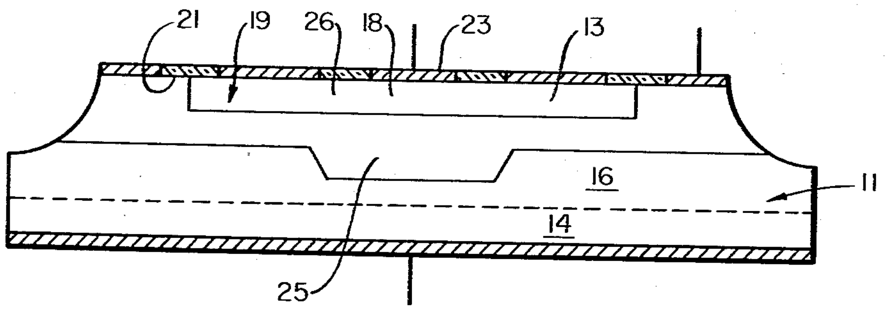
FIGURE 4 is a sectional view of a mesa power transistor in accordance with the invention.

It is apparent that the invention is equally as applicable to a mesa type transistor which includes an inset emitter region with the base and collector contacts extending to the sides of the device such as shown in FIGURE 4. In FIGURE 4, the same reference numerals are applied to the regions corresponding to those of FIGURES 1, 2 and 3.

Figure 5:
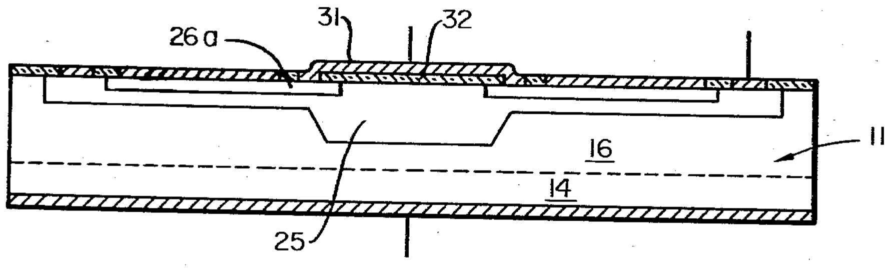
FIGURE 5 is a sectional view of another planar power transistor in accordance with the invention taken generally along the same line of a transistor as that of FIGURE 2.
Figure 6:
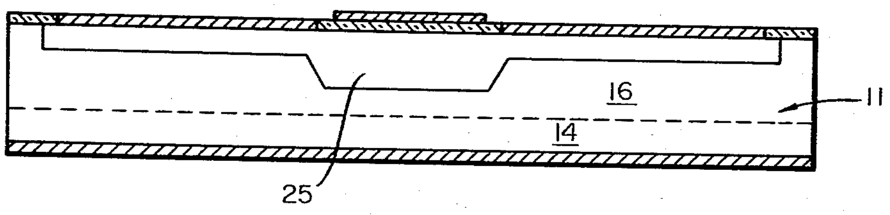
FIGURE 6 is a sectional view of the same power transistor as shown in FIGURE 5 taken generally along the same line as that of FIGURE 3.

Referring to FIGURES 5 and 6, there is shown a device in which the emitter region is in the form of a plurality of segments which are connected to a common emitter contact 31 carried by an oxide layer 32. Electrical connection to the emitter segments is through the emitter portion 26*a* which introduces the series resistance. Except for the lack of an emitter portion common to all of the segments, the figures correspond to FIGURES 2 and 3 and, therefore, bear like reference numerals. It is to be observed that by elimination of the common emitter portion, the inactive area of the transistor is reduced since the low alpha base portion can be reduced to a small area opposite the common bus and the series portion of the emitter.

I claim:

1. A semiconductor device, comprising:

a body of semiconductor material having first and second regions of given and opposite respective conductivity types with a P-N junction therebetween, said first region having a central portion and a peripheral portion;

means for confining any current flowing across said junction through said first region substantially to said peripheral portion;

resistive means contiguous with said body and contacting said peripheral portion; and an electrode contacting said resistive means, said resistive means introducing resistance in series with substantially all parts of said peripheral portion, the value of said resistance being sufficient to equalize the density of said current throughout said peripheral portion.

2. A semiconductor device according to claim 1, wherein said resistive means comprises an integral part of said first region disposed between said central portion and said peripheral portion.

3. A semiconductor device according to claim 1, wherein said first region is inset into said second region from a given surface of said body.

4. A semiconductor device according to claim 3, wherein said electrode is disposed on said given surface contiguous with said central portion.

5. A semiconductor device according to claim 4, wherein said resistive means comprises an integral portion of said first region surrounding said central portion.

6. A semiconductor device according to claim 5, wherein a part of said integral portion adjacent said given surface is notched thereby to increase the resistance of said integral portion.

7. A semiconductor device according to claim 5, further comprising a conductive layer disposed on said given surface contiguous with said peripheral portion thereby to maintain a substantially uniform operating potential across the portion of said junction through which said confined current flows.

8. A semiconductor device according to claim 1, further comprising a third region of said given conductivity type forming an additional P-N junction with said second region, wherein said confining means comprises a relatively inactive portion of said second region disposed between said central portion and said additional junction, said inactive portion having a substantially greater thickness than the portion of said second region disposed between said peripheral portion and said additional junction.

9. A semiconductor device according to claim 8, wherein said resistive means comprises an integral part of said first region disposed between said central portion and said peripheral portion.

10. A semiconductor device according to claim 9, wherein said first region is inset into said second region from a given surface of said body, said electrode being disposed on said given surface contiguous with said central portion, said resistive means surrounding said central portion.

11. A semiconductor device according to claim 10, further comprising a metallic layer disposed on said given surface contiguous with said peripheral portion.

12. A transistor, comprising:

a body of semiconductor material having

- a collector region of one conductivity type,
- a base region of opposite conductivity type inset into said collector region from a given surface of said body and forming a first P-N junction therewith, and
- an emitter region of said one conductivity type inset into said base region from said given surface and forming a second P-N junction therewith,
- said emitter region comprising a central portion having a plurality of fingers extending outwardly therefrom, the portion of said base region disposed between said first P-N junction and said central portion being substantially thicker than the portions of said base region disposed between said first P-N junction and each of said fingers thereby rendering said central portion relatively inactive; and an electrode disposed on said given surface and contacting said central portion, at least a part of the surface of said emitter region disposed between said central portion and the outer extremity of each of said fingers not being contacted by said electrode such that each of said parts introduces resistance in series between said electrode and a corresponding one of said outer extremities thereby to stabilize any current flowing through said fingers via said electrode.

13. A transistor according to claim 12, wherein said electrode is disposed only on said central portion.

14. A transistor according to claim 12, further comprising a metallic layer disposed on said given surface contiguous with at least one of said outer extremities.

15. A transistor according to claim 12, wherein said emitter region is substantially star-shaped.

16. A transistor according to claim 12, wherein said emitter region is substantially comb-like.

17. A transistor according to claim 12, wherein said emitter region has a backbone-and-rib structure.

References Cited

UNITED STATES PATENTS

| | | | |
|---|---|---|---|
| 3,214,652 | 10/1965 | Knowles | 317—235 |
| 3,286,138 | 11/1966 | Shockley | 317—235 |
| 3,260,900 | 7/1966 | Shombert | 317—234 |
| 3,210,621 | 10/1965 | Strull | 317—235 |
| 3,191,070 | 6/1965 | Jones et al. | 317—88.5 |
| 2,924,760 | 2/1960 | Herlet | 317—235 |

JAMES D. KALLAM, *Primary Examiner.*

JOHN W. HUCKERT, *Examiner.*

J. SHEWMAKER, *Assistant Examiner.*